(12) United States Patent
Kulasekeram et al.

(10) Patent No.: US 7,345,902 B2
(45) Date of Patent: Mar. 18, 2008

(54) OPTOELECTRONIC DEVICE

(75) Inventors: Nishanth Kulasekeram, Cambridge (GB); Simon Tam, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 54 days.

(21) Appl. No.: 11/081,711

(22) Filed: Mar. 17, 2005

(65) Prior Publication Data
US 2005/0207204 A1  Sep. 22, 2005

(30) Foreign Application Priority Data
Mar. 19, 2004  (GB) ................... 0406235.2

(51) Int. Cl.
*G11C 11/22* (2006.01)
*G11C 11/42* (2006.01)

(52) U.S. Cl. ................. 365/64; 365/145
(58) Field of Classification Search ......... 365/215, 365/64, 65, 145, 243, 106, 108, 117, 118
See application file for complete search history.

(56) References Cited

U.S. PATENT DOCUMENTS

| | | | |
|---|---|---|---|
| 4,789,964 A * | 12/1988 | Krilic | 365/115 |
| 4,845,482 A * | 7/1989 | Howard et al. | 345/58 |
| 5,233,556 A * | 8/1993 | Matsuda et al. | 365/112 |
| 5,461,400 A * | 10/1995 | Ishii et al. | 345/182 |
| 6,028,784 A * | 2/2000 | Mori et al. | 365/145 |
| 6,215,462 B1 * | 4/2001 | Yamada et al. | 345/76 |
| 6,297,491 B1 * | 10/2001 | Mangerson | 250/208.1 |
| 6,888,974 B2 * | 5/2005 | Block et al. | 385/15 |

FOREIGN PATENT DOCUMENTS

| | | |
|---|---|---|
| EP | 0 270 149 A1 | 6/1988 |
| JP | 2004126153 A * | 4/2004 |

OTHER PUBLICATIONS

"Ultra Low Power Consumption and High Definition: A 400dpi Reflective Storage Ferroelectric Liquid Crystal Display"; Diana C Ulrich, Brian Henley, Craig Tombling, Martin D Tillin, David Smith, Nick Dodgson; Sharp Technical Journal No. 3 (Aug. 2001); Retrieved from "http://sharp-world.com/corporate/info/rd/tj3/3-5.html".*

* cited by examiner

*Primary Examiner*—Van Thu Nguyen
*Assistant Examiner*—Douglas King
(74) *Attorney, Agent, or Firm*—Oliff & Berridge, PLC (57) ABSTRACT

An optoelectronic device is disclosed with a light source, a wave guide and a first signal line, wherein a cell is formed at the intersection between the wave guide and the first signal line. The cell includes a light activated switch and an output device. The optoelectronic device may be an optoelectronic memory wherein the output device is a storage unit. Alternatively the optoelectronic device may be an optoelectronic display device wherein the output device is a light emitting device or a liquid crystal device.

9 Claims, 12 Drawing Sheets

OPTOELECTRONIC DEVICE

FIELD OF THE INVENTION

The present invention relates to an optoelectronic device which is an optoelectronic memory or an optoelectronic display. More specifically the present invention relates to volatile and non-volatile optoelectroinc memory.

DESCRIPTION OF THE PRIOR ART

There are two types of memory, volatile memory and non-volatile memory. Volatile memory loses it data content when the power supply is removed. Examples of volatile memory are static random access memory (SRAM) and dynamic random access memory (DRAM). Non-volatile memory does not lose its data content when the power supply is removed. Examples of non-volatile memory are read only memory (ROM), erasable/programmable read only memory (EPROM), electrically erasable/programmable read only memory (EEPROM) and FLASH memory.

Previously, volatile memory offered better cost advantages and higher capacity over non-volatile memory. However, due to recent advances in non-volatile memory technology, non-volatile memory might replace volatile memory in the near future.

Figure 1:
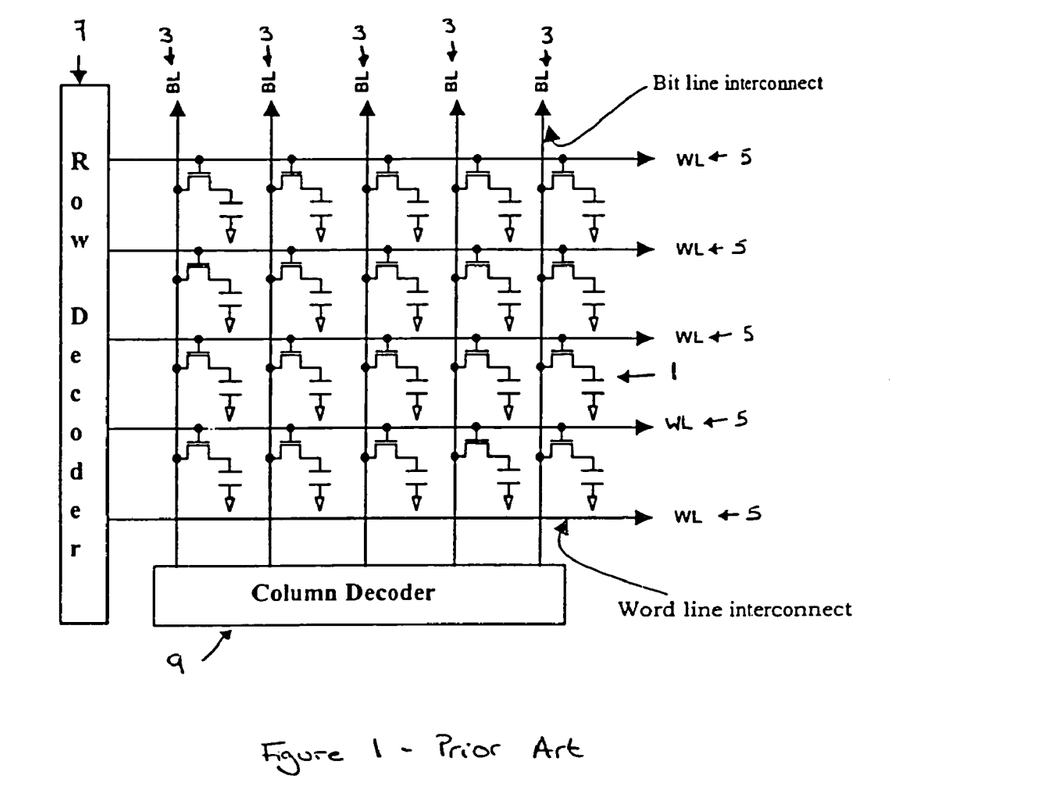
FIG. 1 illustrates the architecture of a memory of the prior art, comprising a matrix of memory cells.

FIG. 1 illustrates the architecture of a memory of the prior art, comprising a matrix of memory cells 1. The memory comprises a row decoder 7, a column decoder 9, a plurality of word lines 5 and a plurality of bit lines 3. Memory cells 1 are formed at the intersection between the word lines 5 and the bit lines 3. Each memory cell 1 comprises a transistor 11 and a storage capacitor 13.

The row decoder 7 can assert an electrical signal to select the memory cells 1 arranged on the same word line 5 (i.e. in the same row). The column decoder 9 can assert an electrical signal to select the memory cells 1 arranged on the same bit line 3 (i.e. in the same column). At the intersection between the selected bit line 3 and the selected word line 5 is the selected memory cell 1 where binary information can be accessed, stored or changed. The memory cells 1 which receive only a selected bit line signal, only a selected word line signal, or do not receive either signal are unselected memory cells 1.

Figure 2:
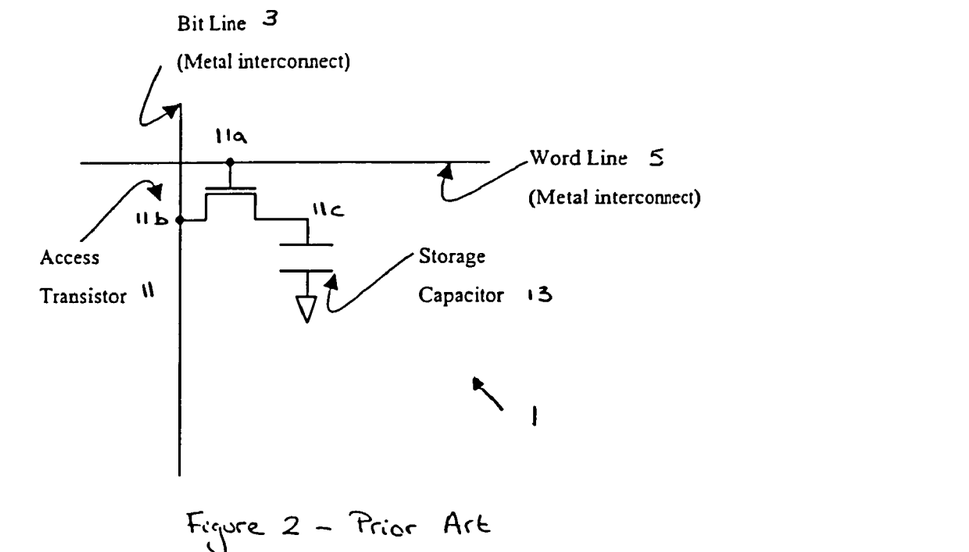
FIG. 2 illustrates a memory cell of the memory illustrated in FIG. 1.

FIG. 2 illustrates a memory cell 1 of the prior art. The gate terminal 11$a$ of the transistor 11 is connected to the word line 5, the source terminal 11$b$ of the transistor 11 is connected to the bit line 3 and the drain terminal 11$c$ of the transistor 11 is connected to the storage capacitor 13. The transistor 1 controls the connection between the storage capacitor 13 and the bit line 3.

As device sizes reduce, the interconnect capacitance far exceeds the capacitance at gate terminal 11$a$ of the transistor 11. Therefore long word and bit lines for a large matrix of memory cells must be avoided. This can be achieved by breaking a large matrix into sub-memory blocks interconnected by local and global word and bit lines. However, this causes an increase in the silicon area for extra block decoder and control circuitry, as well as lengthening the access and signalling times. This in turn leads to an increase in power consumption.

U.S. Pat. No. 4,789,964 (G. Krilic) describes an optoelectronic DRAM system. Each memory cell comprises a first and second photodiode and an optical switch. The first and second photodiodes are electrically connected for the exchange of a reverse bias condition from one photodiode to the other, when either one is exposed to light to cause a photocurrent to flow and thereby to define logical "1" and "0" states. The optical switch is connected in parallel with one of the photodiodes and is light transmissive in only one of the reverse bias conditions, thereby detecting the logical state of the cell when the optical switch is exposed to light.

SUMMARY OF THE INVENTION

In order to overcome the above mentioned problems, the present invention provides an optoelectronic device comprising: a light source; a wave guide; and a first signal line; wherein a cell is formed at the intersection between the wave guide and the first signal line, the cell comprising a light activated switch and an output device.

The optoelectronic memory of the present invention is advantageous as capacitive loading of the word lines is eliminated, increasing in the number of memory cells which can share the same wave guide (word line) without lengthening the addressing time. This reduces the access times and increases throughput. By increasing the word length a much higher data bandwidth can be achieved. In addition there is no electrical cross talk between the wave guides (word lines) and the bit lines. Furthermore, subdividing the memory into smaller blocks is not required, resulting in more compact and simpler designs that substantially reduce power dissipation.

DESCRIPTION OF THE DRAWINGS

Embodiments of the present invention will now be described by way of further example only and with reference to the accompanying drawings, in which.

DETAILED DESCRIPTION

Figure 3:
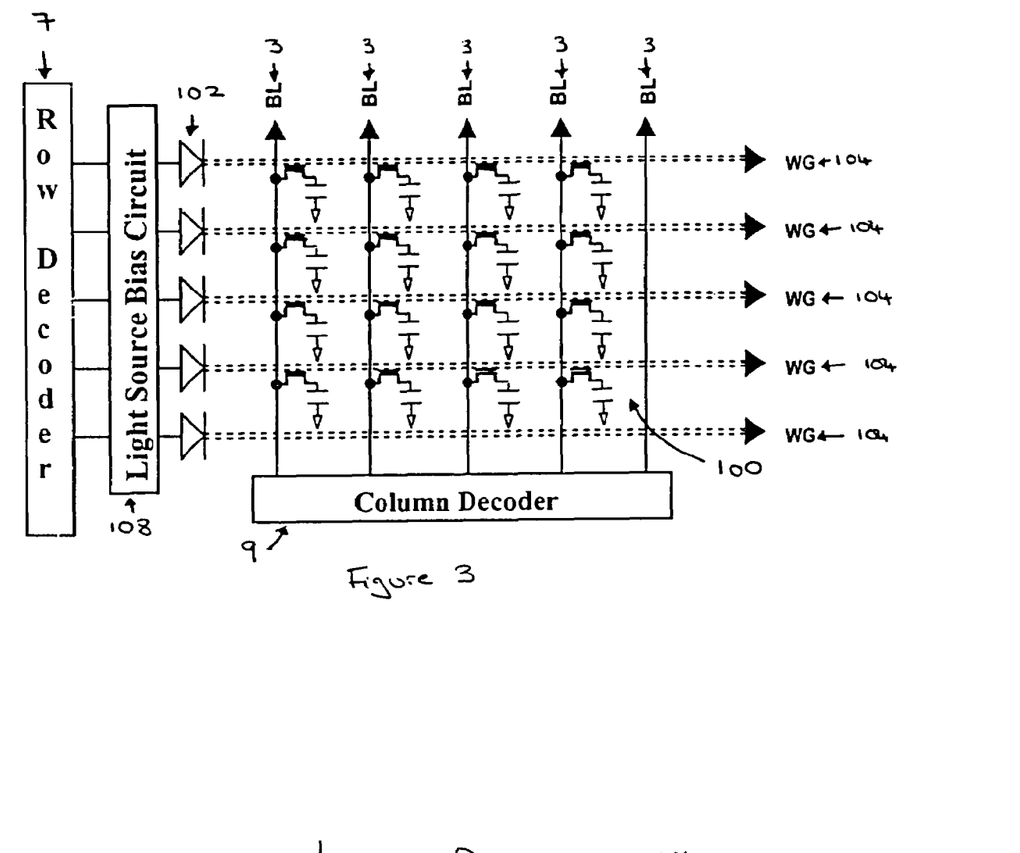
FIG. 3 illustrates the architecture of an optoelectronic memory of a first embodiment of the present invention.

FIG. 3 illustrates the architecture of an optoelectronic memory of a first embodiment of the present invention which can be used in SRAM. The memory circuit comprises a row decoder 7, a light source bias circuit 108, a plurality of light sources 102, a plurality of wave guides 104, a column decoder 9 and a plurality of bit lines 3. The plurality of light sources 102 may be an array of light emitting devices, a laser or may be one light source adapted to illuminate only a selected wave guide.

Memory cells 100 are formed at the intersections between the wave guides 104 and the bit lines 3. Each memory cell 100 comprises a light activated switch 110 and a storage unit 112. In FIG. 3 the light activated switch 110 is a light activated transistor, whilst the storage unit 112 is a capacitor. The light activated switch 110 can be any light activated switch such as a photo switch.

Figure 4:
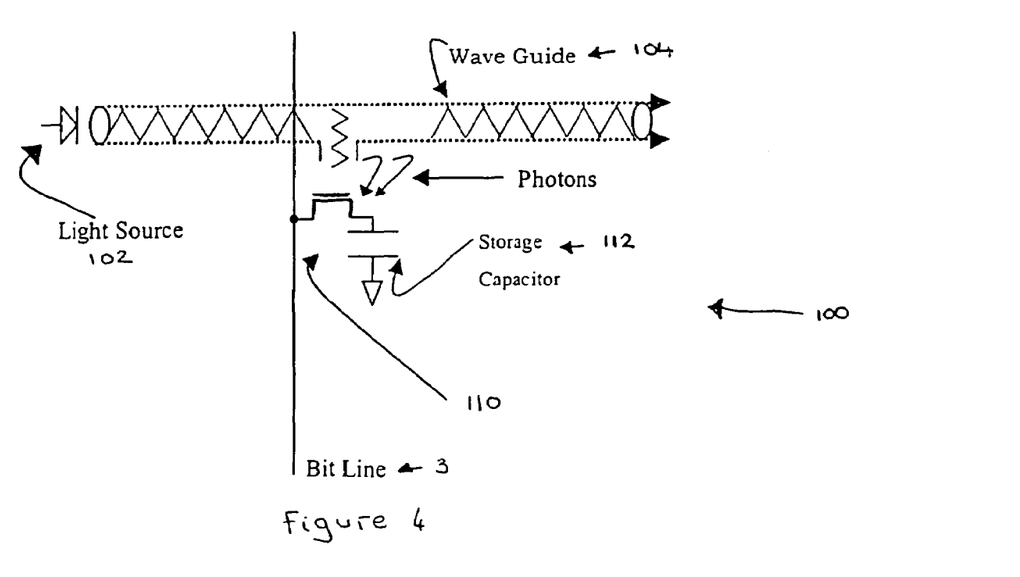
FIG. 4 illustrates an enlarged view of a memory cell illustrated in FIG. 3.

FIG. 4 illustrates an enlarged view of a memory cell 100 illustrated in FIG. 3.

The row decoder 7 determines which row of memory cells 100 to select, whilst the column decoder 9 determines which column of memory cells 100 to select. The memory cell 100 positioned at the intersection of the selected row and the selected column is the selected memory cell 100 into which information can be written or from which information can be read.

The row decoder 7, controls the light source bias circuit 108, which in turn controls the plurality of light sources 102. When a row is selected, the row decoder 7 activates the light source bias circuit 108, which in turn activates the light source 102 which corresponds to the selected row. The wave guides 104 are optically coupled to the plurality of light sources 102 and the light activated switch 110 of each memory cell 100. Consequently, when activated, light from the selected light source 102 is transmitted along the selected wave guide 104 to the light activated switch 110 of the selected memory cell 100. The light activated switch 110, which may be a light activated transistor, is then activated and charges the capacitor.

Figure 5:
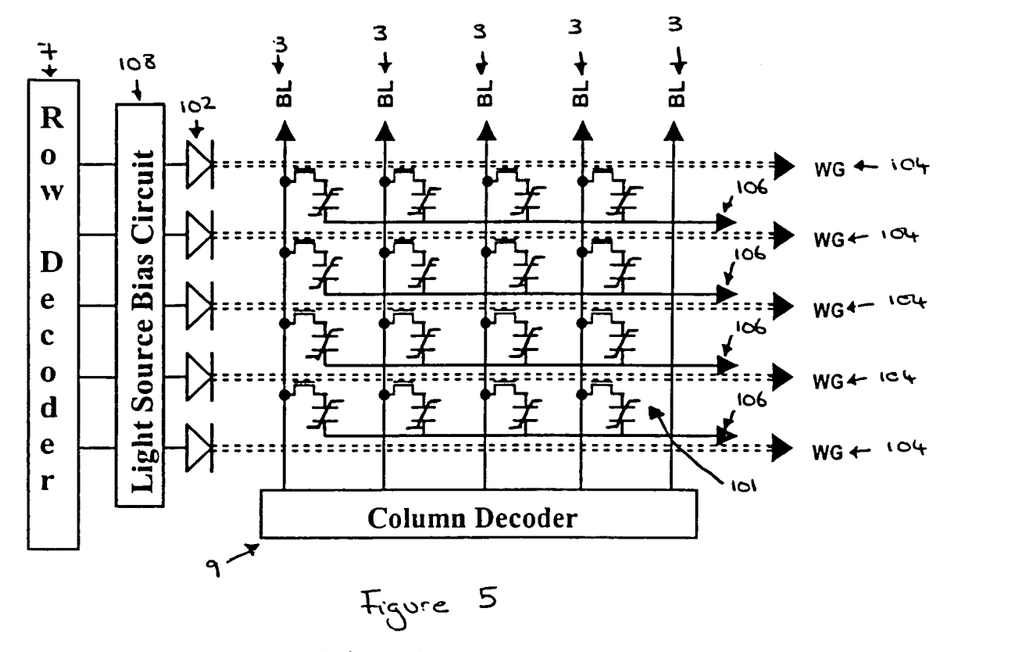
FIG. 5 illustrates the architecture of a non-volatile optoelectronic memory of a second embodiment of the present invention.
Figure 6:
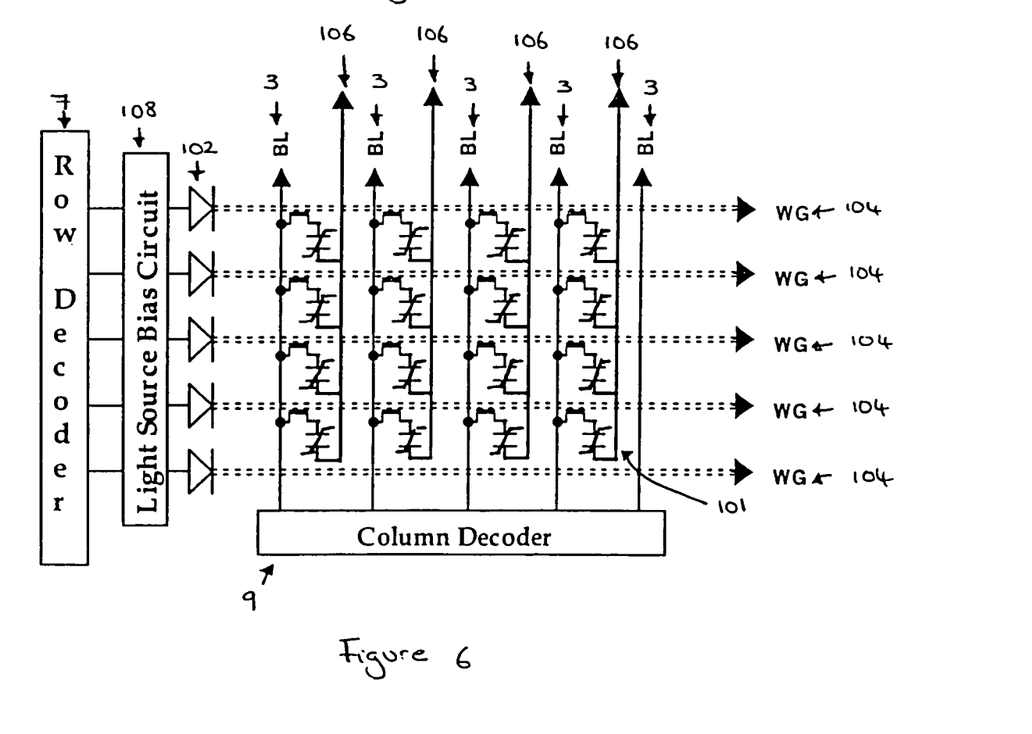
FIG. 6 illustrates the architecture of a non-volatile optoelectronic memory of a second embodiment of the present invention.

FIGS. 5 and 6 illustrate the architecture of a non-volatile optoelectronic memory of a second embodiment of the present invention. The memory circuit comprises a row decoder 7, a light source bias circuit 108, a plurality of light sources 102, a plurality of wave guides 104, a column decoder 9, a plurality of bit lines 3 and a plurality of bias lines 106. Memory cells 101 are formed at the intersections between the wave guides 104 and the bit lines 3. Each memory cell 101 comprises a light activated switch 110 and a storage unit 112. In FIGS. 5 and 6, the light activated switch 110 is a light activated transistor, whilst the storage unit 112 is a ferroelectric random access memory (FERAM) capacitor. The plurality of light sources 102 may be an array of light emitting devices, a laser or may be one light source adapted to illuminate only a selected wave guide.

Figure 7:
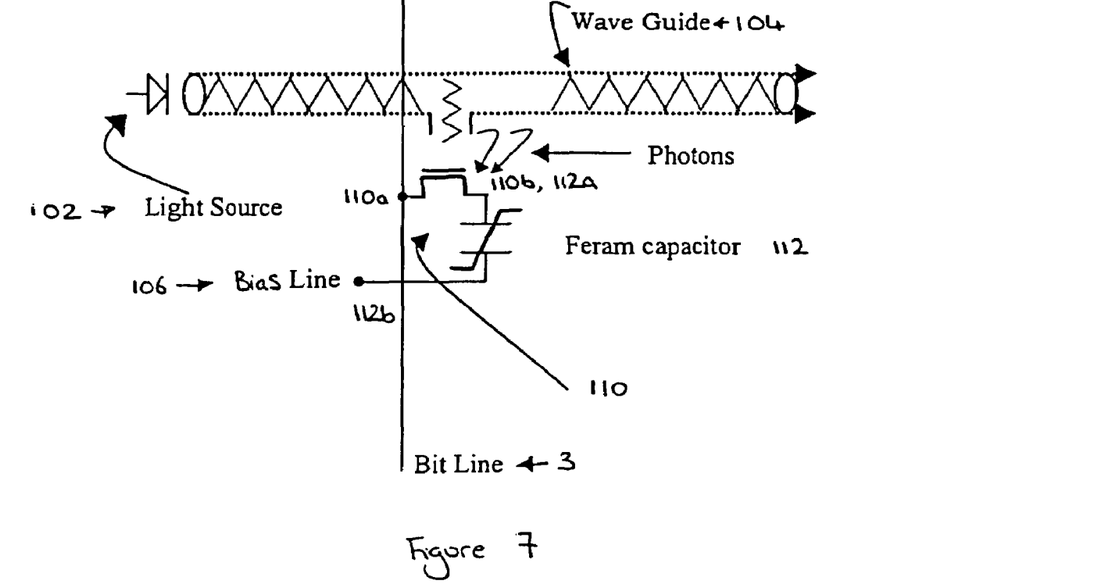
FIG. 7 illustrate an enlarged view of a memory cell illustrated in FIG. 5.

FIG. 7 illustrates an enlarged view of a memory cell 101 illustrated in FIG. 5. FIG. 7 illustrates a source terminal 110a of the transistor 110 as being connected to the bit line 3, whilst a drain terminal 110b of the transistor 110 is connected to one terminal 112a of the FERAM capacitor 112, and another terminal 112b of the FERAM capacitor 112 as being connected to the bias line 106. However, the source terminal 110a of the transistor 110 may be connected to the bias line 106 and the other terminal 112b of the FERAM capacitor 112 may be connected to the bit line 3.

The bias lines 106 may be either parallel to the wave guides 104, as illustrated in FIG. 5, or perpendicular to the wave guides 104, as illustrated in FIG. 6.

The row decoder 7 determines which row of memory cells 101 to select, whilst the column decoder 9 determines which column of memory cells 101 to select. The memory cell 101 positioned at the intersection of the selected row and the selected column is the selected memory cell 101 into which information can be written or from which information can be read.

The row decoder 7, controls the light source bias circuit 108, which in turn controls the plurality of light sources 102. When a row is selected, the row decoder 7 activates the light source bias circuit 108, which in turn activates the light source 102 that corresponds to the selected row. The wave guides 104 are optically coupled to the plurality of light sources 102 and the light activated switches 110 of each memory cell 101. Consequently, when activated, light from the selected light source 102 is transmitted along the selected wave guide 104 to the light activated switch 110 of the selected memory cell 101.

Figure 8:
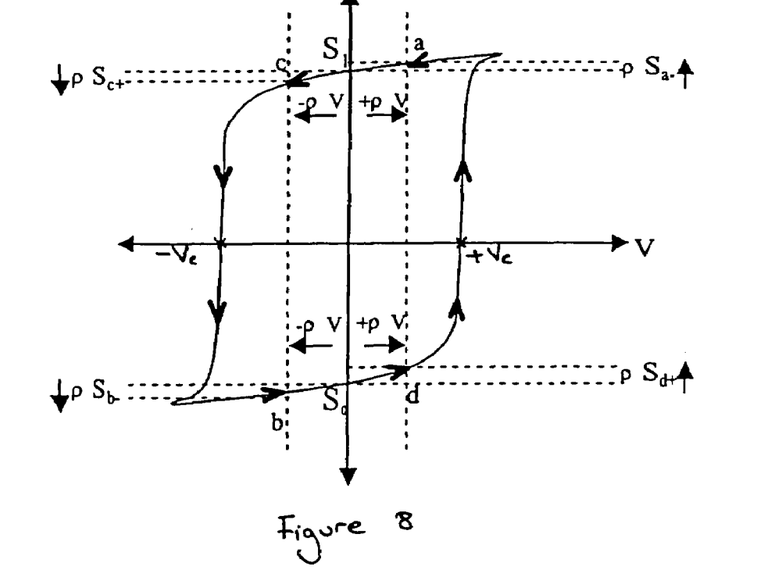
FIG. 8 illustrates a hysteresis diagram of a FERAM capacitor.

A hysteresis diagram for a FERAM capacitor is illustrated in FIG. 8, in which the horizontal axis represents voltage and the vertical axis represents the polarisation state. It can be seen from FIG. 8 that the FERAM capacitor has two polarisation states $S_1$ and $S_0$ and also exhibits polarisation hysteresis. The polarisation states $S_1$ and $S_0$ are stable states at which the voltage is zero, and correspond to the two binary levels in a digital memory, i.e. a digital "1" or a digital "0". The polarisation state stored in the FERAM capacitor is retained when electric power is removed. To switch a FERAM capacitor from one polarisation state to the other polarisation state, dependent upon the current polarisation state of the capacitor, either a negative voltage pulse having a magnitude which is more negative than a coercive voltage $-V_c$ or a positive voltage pulse having a magnitude which is more positive than a coercive voltage $V_c$ must be applied to the capacitor. The coercive voltage $V_c$ is the voltage required to change the state of the capacitor.

The polarisation state of the FERAM capacitor depends on its local terminal voltage relative to the coercive voltage $V_c$. Thus, in order to write a binary "1" (a positive polarisation state $S_1$) into a memory cell, a positive voltage of a magnitude which is more positive than the voltage $V_c$ must be applied to the FERAM capacitor. In order to write a binary "0" (a negative polarisation state $S_0$) into a memory cell, a negative voltage of a magnitude which is more negative than the voltage $-V_c$ must be applied to the capacitor.

In order to write a digital "1" to the memory cell 101 illustrated in any one of FIGS. 5 to 7, the voltage of the bit line $V_{BL}$ is set high and the voltage of the bias line $V_{SL}$ is set low. The selected light source 102 is then activated. When the light activated switch 110 of the selected memory cell 101 senses light, it turns on and transfers the bit line voltage $V_{BL}$, which is high, to the terminal 112a of the FERAM capacitor 112. The other terminal 112b of the FERAM capacitor 112 is connected to the bias line voltage $V_{SL}$, which is set low. Consequently, a high positive voltage, having a magnitude which is greater than the coercive voltage of the FERAM capacitor 112, is applied across the FERAM capacitor 112 and a digital "1" is written to the memory cell 101. The specific values of the voltage applied at the bit line 3 and bias line 106 are not critical to the writing of a digital "1" to the FERAM capacitor 112, as long as equation 1 below is satisfied.

$$V_{BL}-V_{SL}>V_C \qquad \text{Equation 1.}$$

Figure 9:
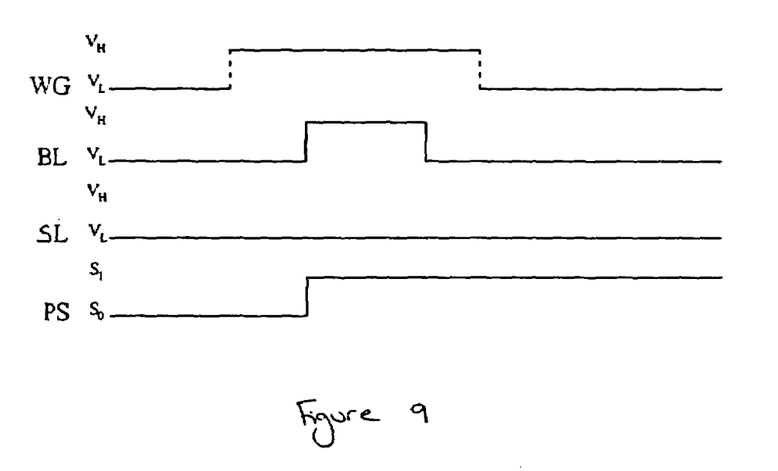
FIG. 9 illustrates a timing diagram for writing a digital "1" to a memory cell of a second embodiment of the present invention.
Figure 10:
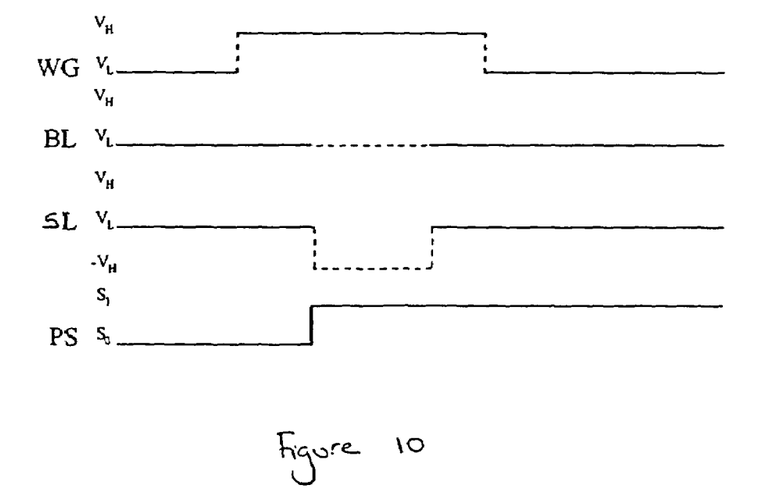
FIG. 10 illustrates a timing diagram for writing a digital "1" to a memory cell of a second embodiment of the present invention, in which a negative driving voltage is used.

FIG. 9 illustrates a timing diagram for writing a digital "1" to a memory cell 101. FIG. 10 illustrates a timing diagram for writing a digital "1" to a memory cell, in which a negative driving voltage is used. Contrary to the above description, the wave guide 104 is activated prior to the voltage of the bit line $V_{BL}$ being set high in FIG. 9, and the voltage of the bias line $V_{SL}$ being set negative in FIG. 10.

In order to write a digital "0" to the memory cell 101 illustrated in any one of FIGS. 5 to 7, the voltage of the bit line $V_{BL}$ is set low, and the voltage of the bias line $V_{SL}$ is set high. The selected light source 102 is then activated. When the light activated switch 110 of the selected memory cell 101 senses light, it turns on and transfers the bit line voltage $V_{BL}$, which is low, to the terminal 112a of the FERAM capacitor 112. The other terminal 112b of the FERAM capacitor 112 is connected to the bias line voltage $V_{SL}$, which is high. Consequently, a high negative voltage, having a magnitude which is greater than the negative coercive voltage of the FERAM capacitor 112, is applied across the FERAM capacitor 112 and a digital "0" is written to the memory cell 101. The specific values of the voltage applied at the bit line 3 and the bias line 106 are not critical to the writing of a digital "0" to the FERAM capacitor 112, as long as equation 2 below is satisfied.

$$V_{SL}-V_{BL}>V_C \qquad \text{Equation 2.}$$

Figure 11:
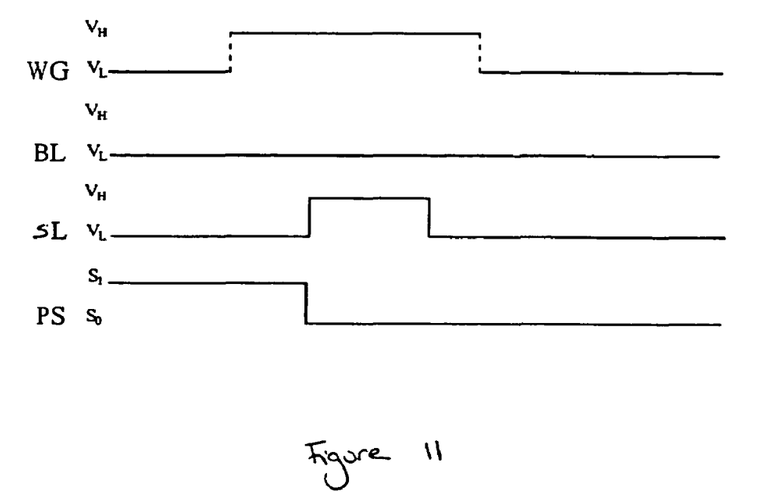
FIG. 11 illustrates a timing diagram for writing a digital "0" to a memory cell of a second embodiment of the present invention.
Figure 12:
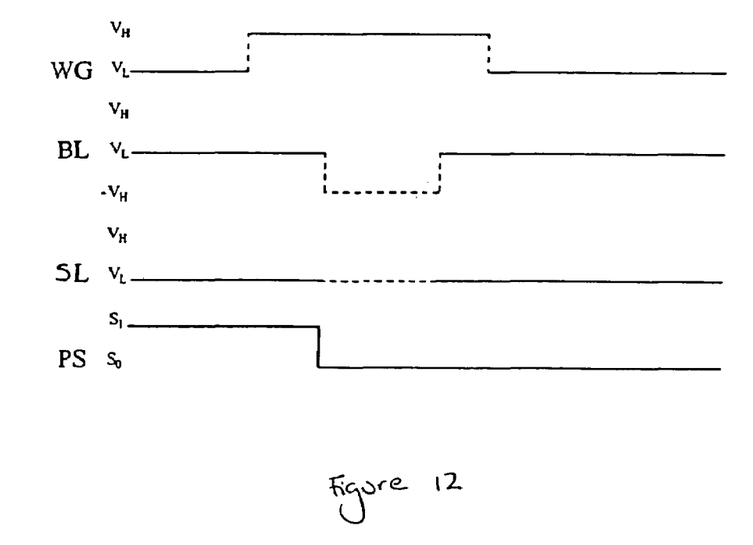
FIG. 12 illustrates a timing diagram for writing a digital "0" to a memory cell of a second embodiment of the present invention, in which a negative driving voltage is used.

FIG. 11 illustrates a timing diagram for writing a digital "0" to a memory cell 101. FIG. 12 illustrates a timing diagram for writing a digital "0" to a memory cell 101, in which a negative driving voltage is used. In contrast to the above description, the wave guide 104 is activated prior to the voltage of the bias line $V_{SL}$ being set high in FIG. 11 and the voltage of the bit line $V_{BL}$ being set negative in FIG. 12.

Figure 13:
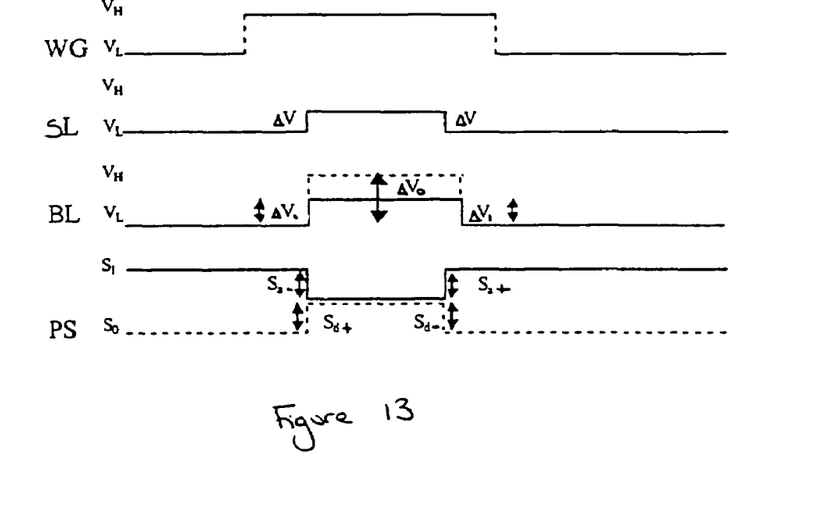
FIG. 13 illustrates a timing diagram for reading a digital "1" or "0" from a memory cell of a second embodiment of the present invention.

FIG. 13 illustrates the timing diagram for reading of a digital "1" or "0" from a memory cell 101. In order to read data from the memory cell 101, a sense amplifier is connected to the bit line 3. The polarisation state stored in the FERAM capacitor 112 is read by setting the bit line voltage $V_{BL}$ low. A small excitation voltage $\Delta V$ is then applied at the bias line 106 and a change in the bit line voltage $V_{BL}$ is sensed by the sense amplifier. The change in the bit line voltage $V_{BL}$ depends on the polarisation state of the FERAM capacitor 112. The polarisation state $S_1$ corresponds to the FERAM capacitor 112 storing a digital "1" and the polarisation state $S_0$ corresponds to the FERAM capacitor 112 storing a digital "0". If the polarisation state of the FERAM capacitor 112 is $S_1$, then the change in bit line voltage $V_{BL}$ is $\Delta V_1$. However, if the polarisation state of the FERAM capacitor 112 is $S_0$, then the change in bit line voltage $V_{BL}$ is $\Delta V_0$. The change in bit line voltage $\Delta V_0$ is greater than the change in bit line voltage $\Delta V_1$. The sense amplifier is able to use a change in bit line voltage to distinguish between the two digital states.

Figure 23:
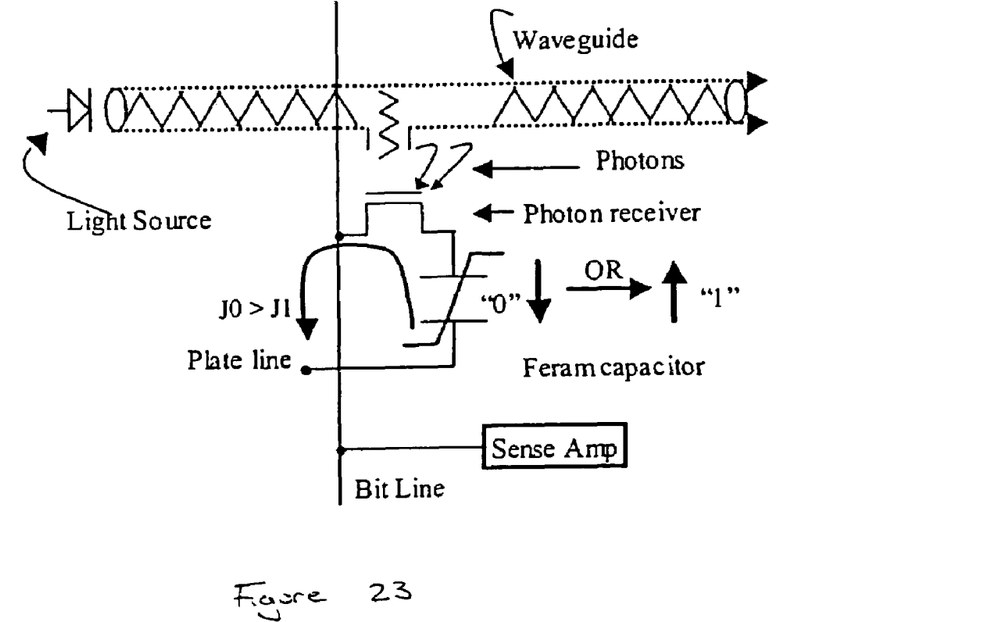
FIG. 23 is a representation of the reading of a memory cell as shown in FIG. 7.

The reading of the memory cell and the resultant current flow is represented in FIG. 23, in which a sense amplifier is connected to the bit line 3 to detect $\Delta V_1$ or $\Delta V_0$ as the case may be.

It is possible to perform non-destructive readout (NDRO) from a FERAM capacitor 112. NDRO occurs when the polarisation state of the FERAM capacitor is determined without corrupting the polarisation state, so that the polarisation state can be read repeatedly.

In accordance with convention, the hysteresis diagram shown in FIG. 8 includes four regions, marked "a", "c", "b" and "d", of an anticlockwise flow of arrows. Assuming the current polarisation state is $S_1$, then in order to read the polarisation state, a voltage $+\rho V$ (equivalent to $\Delta V$ discussed above) may be applied to the FERAM capacitor. The application of $+\rho V$ causes the polarisation state to move from the stable state of $S_1$ (where the voltage is zero) towards the region "a" in a clockwise manner. The polarisation state is moved by an amount $\rho S_{a-}$. According to convention, a negative polarisation state is achieved by moving against the direction of arrows.

Having moved from the stable state $S_1$ by $\rho S_{a-}$ when the voltage $+\rho V$ is applied, the polarisation state returns to the stable state $S_1$ when $+\rho V$ is removed. Thus, the anticlockwise flow of the arrows is followed to move back by an amount $\rho S_{a+}$ to the stable state $S_1$.

As the result of traversing a voltage $\rho V$ from either of stable states $S_1$ and $S_0$ and then returning back to the respective stable state, the stored digital state is retained. If a voltage $\rho V$ greater than a certain threshold were to be applied, the polarisation would not return to its original stable state and the contents of the FERAM capacitor would be corrupted.

Figure 14:
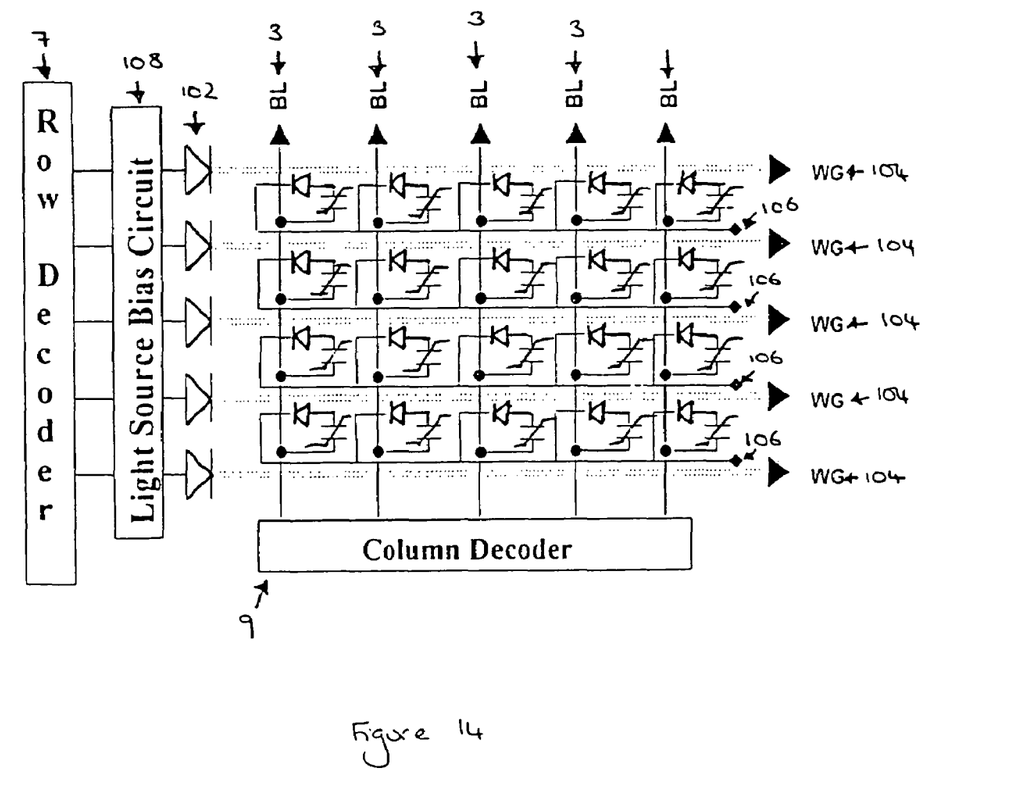
FIG. 14 illustrates the architecture of a non-volatile optoelectronic memory of the third embodiment of the present invention.
Figure 15:
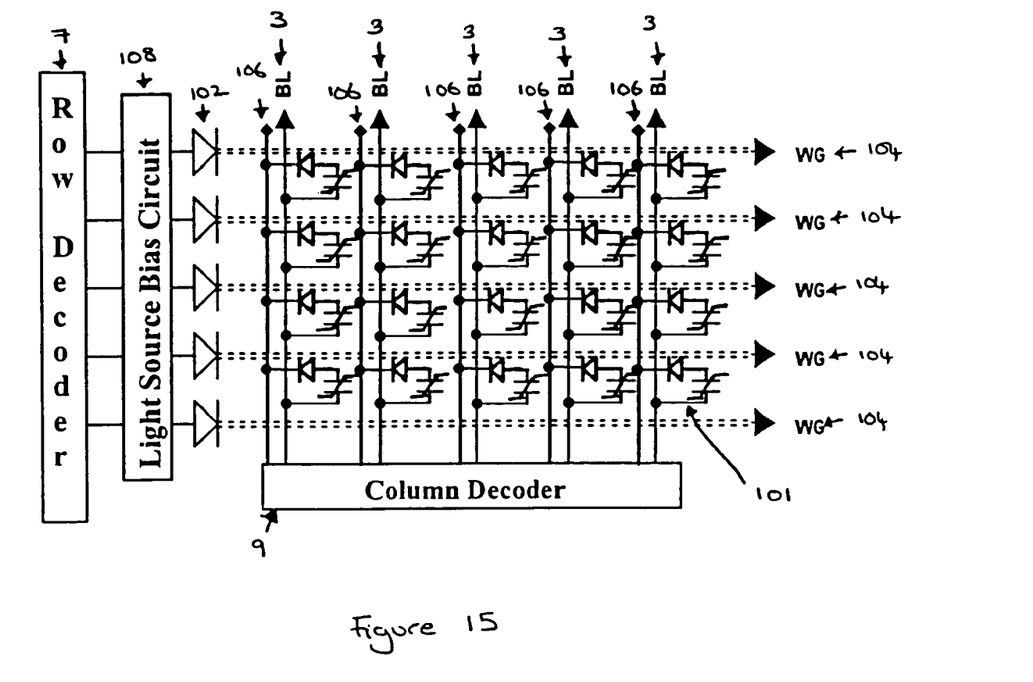
FIG. 15 illustrates the architecture of a non-volatile optoelectronic memory of the third embodiment of the present invention.
Figure 16:
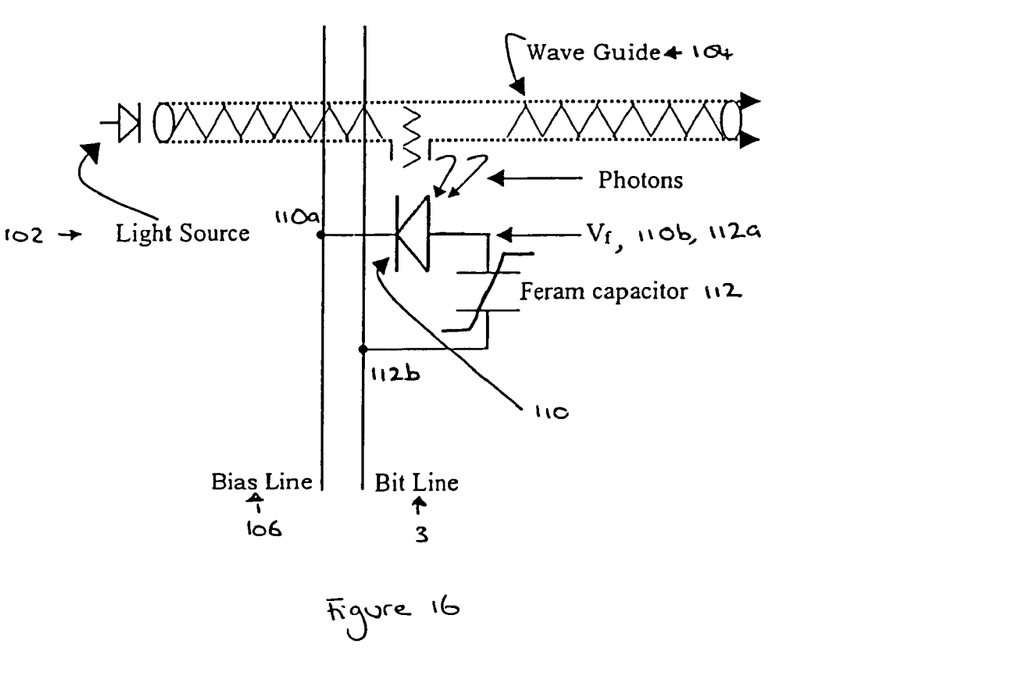
FIG. 16 illustrate an enlarged view of a memory cell illustrated in FIG. 15.

FIGS. 14 and 15 illustrate the architecture of a non-volatile optoelectronic memory of a third embodiment of the present invention. As in the second embodiment, the bias lines 106 can be either parallel to the wave guides 104, as illustrated in FIG. 14, or perpendicular to the wave guides 104, as illustrated in FIG. 15. FIG. 16 is an enlarged view of a memory cell illustrated in FIG. 15.

In the third embodiment of the present invention the light activated switch 110 is a photodiode. Again, the plurality of light sources 102 may be an array of light emitting devices, a laser or may be one light source adapted to illuminate only a selected wave guide.

In contrast to the enlarged view of a memory cell of the previous embodiment illustrated in FIG. 7, a negative electrode 110a of the photodiode 110 is connected to the bias line 106, whilst a positive electrode 110b of the photodiode 110 is connected to one terminal 112a of the FERAM capacitor 112, and another terminal 112b of the FERAM capacitor 112 is connected to the bit line 3. However, the negative electrode 110a of the photodiode 110 may be connected to the bit line 3 and the other terminal 112b of the FERAM capacitor 112 may be connected to the bias line 106.

$V_F$ is the voltage at the electrode 112a of the FERAM capacitor 112.

In order to write a digital "1" to the memory cell 101, assuming that the memory cell 101 is currently set as digital "0", the voltage of the bias line $V_{SL}$ is set low, forward biasing the photodiode 110 and thus equalising $V_{SL}$ and $V_F$. This results in the voltage $V_F$ at electrode 112a being set low. The voltage of the bias line $V_{SL}$ is then set high, reverse biasing the photodiode 110, which is required to ensure that sufficient photons can be detected across the reverse bias region of the photodiode 110, and the voltage of the bit line $V_{BL}$ is set low. The selected light source 102 is then activated.

When the photodiode 110 of the selected memory cell 101 senses light (photons) from the wave guide 104, the photodiode 110 generates a current, and hence a voltage across the FERAM capacitor 112 by raising the voltage $V_F$ at electrode 112a of the FERAM capacitor 112 to a high level. The current and hence the voltage which is applied across the FERAM capacitor 112 can be increased or decreased by changing the bias across the photodiode 110. Additionally, the voltage which is applied across the FERAM capacitor 112 can be increased or decreased by changing the intensity of light from the light source 102. If the light source 102 is a laser, for example, then the intensity can be changed by altering the DC bias voltage of the laser. Similar considerations apply in respect of LEDs and other light sources. The other electrode 112b of the FERAM capacitor 112 is connected to the bit line voltage $V_{BL}$, which is low. Consequently, a high positive voltage, having a magnitude which is greater than the coercive voltage of the FERAM capacitor 112, is applied across the FERAM capacitor 112 and a digital "1" is written to the memory cell 101. The specific values of the voltage applied at the bit line 3 and bias line 106 are not critical to the writing of a digital "1" to the FERAM capacitor 112, as long as equations 3 and 4 below are satisfied.

$$V_F - V_{BL} > V_C \qquad \text{Equation 3}$$

$$V_F < V_{SL} \qquad \text{Equation 4}$$

Figure 17:
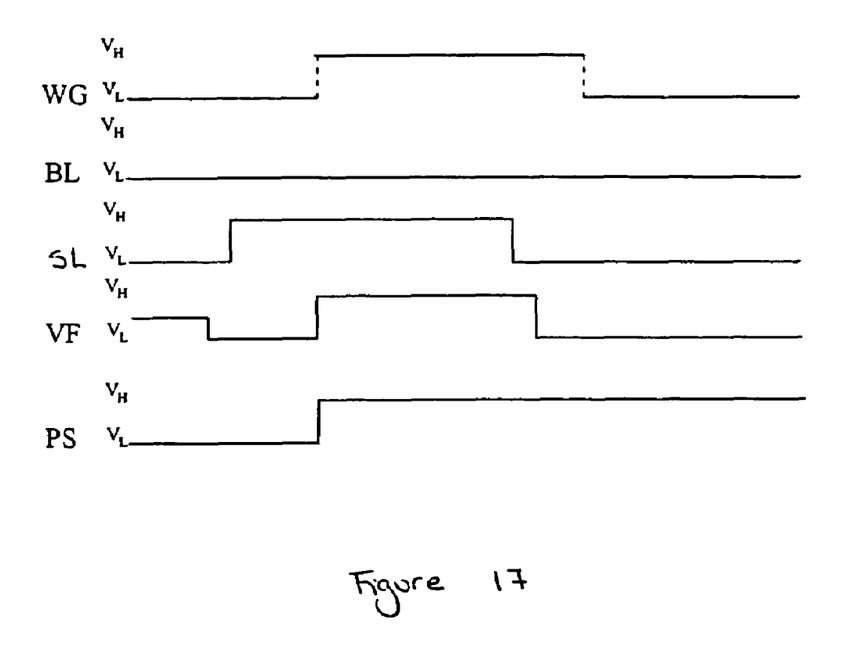
FIG. 17 illustrates the timing diagram for writing a digital "1" to a memory cell of a third embodiment of the present invention.

FIG. 17 illustrates a timing diagram for writing a digital "1" to the memory cell 101.

In order to write a digital "0" to the memory cell 101, assuming that the memory cell 101 is currently set as digital "1", the voltage of the bias line $V_{SL}$ is set low, forward biasing the photodiode 110 so that current flows from $V_F$, at electrode 112a of the FERAM capacitor 112, through the photodiode thereby equalising $V_{SL}$ and $V_F$. This results in the voltage $V_F$ at electrode 112a being set low. The voltage of the bias line $V_{SL}$ is then set high, reverse biasing the photodiode 110, which is required to ensure that sufficient photons can be detected across the reverse bias region of the photodiode 110, and the voltage of the bit line $V_{BL}$ is set low. The selected light source 102 is then activated.

When the photodiode 110 of the selected memory cell 101 senses light (photons) from the wave guide 104, the photodiode 110 generates a current, and hence a voltage across the FERAM capacitor 112 by raising the voltage $V_F$ at electrode 112a of the FERAM capacitor 112. The current and hence the voltage which is applied across the FERAM capacitor 112 can be increased or decreased by changing the bias across the photodiode 110. Additionally, the voltage which is applied across the FERAM capacitor 112 can be increased or decreased by changing the intensity of light from the light source 102. If the light source 102 is a laser, for example, then the intensity can be changed by altering the DC bias voltage of the laser. Similar considerations apply in respect of LEDs and other light sources. The voltage $V_F$ at electrode 112a of the FERAM capacitor 112 is controlled so as not to reach a maximum voltage, it is set to a voltage just above the minimum logic level. At this point, the bit line voltage $V_{BL}$ is toggled high. As the voltage of electrode 112a $V_F$ is set just above the minimum logic level, a high negative voltage, having a magnitude which is greater than the coercive voltage of the FERAM capacitor 112, is applied across the FERAM capacitor 112 and a digital "0" is written to the memory cell 101. The specific values of the voltage applied at the bit line 3 and bias line 106 are not critical to the writing of a digital "0" to the FERAM capacitor 112, as long as equation 5 and 6 below are satisfied.

$$V_{BL} - V_F > V_C \qquad \text{Equation 5}$$

$$V_F < V_{SL} \qquad \text{Equation 6}$$

If the voltage $V_F$ at the electrode 112a of the FERAM capacitor 112 were not to be driven to the voltage just above the minimum logic level, then the voltage $V_F$ at the electrode 112a would simply follow the bit line voltage $V_{BL}$ when it was toggled high. Consequently, the digital "0" would not be written. This property is used to ensure that only the addressed cell is written. More particularly, only one row in an array need be addressed by means of the waveguide when the bit line column is toggled high. Consequently, only cells on the bit line column that are addressed by means of the waveguide meet the required conditions for writing the digital "0". The voltage $V_F$ at the electrode 112a of cells on the bit line column that are not addressed by a waveguide will simply follow the bit line voltage $V_{BL}$ when it was toggled high. Consequently, these cells will not meet the requirement of equation 5 and will not be written into.

Figure 18:
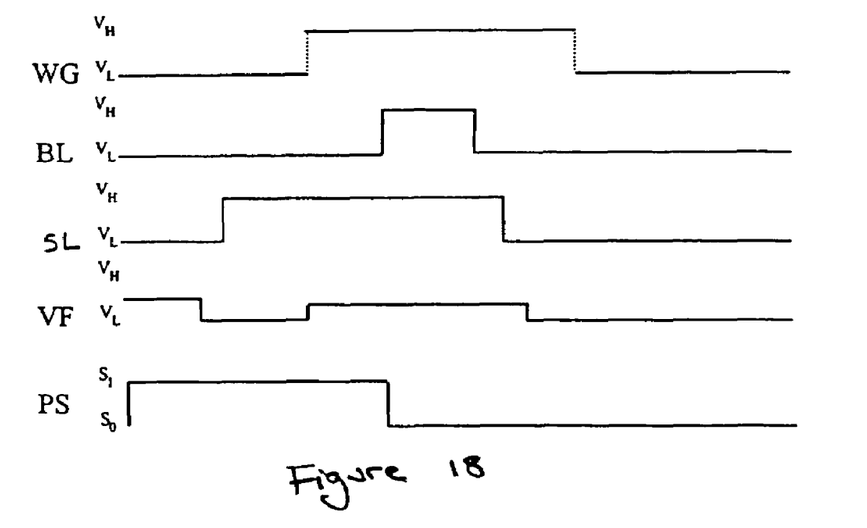
FIG. 18 illustrates timing diagram for writing a digital "0" to a memory cell of a third embodiment of the present invention.

FIG. 18 illustrates a timing diagram for writing a digital "0" to the memory cell 101.

Figure 19:
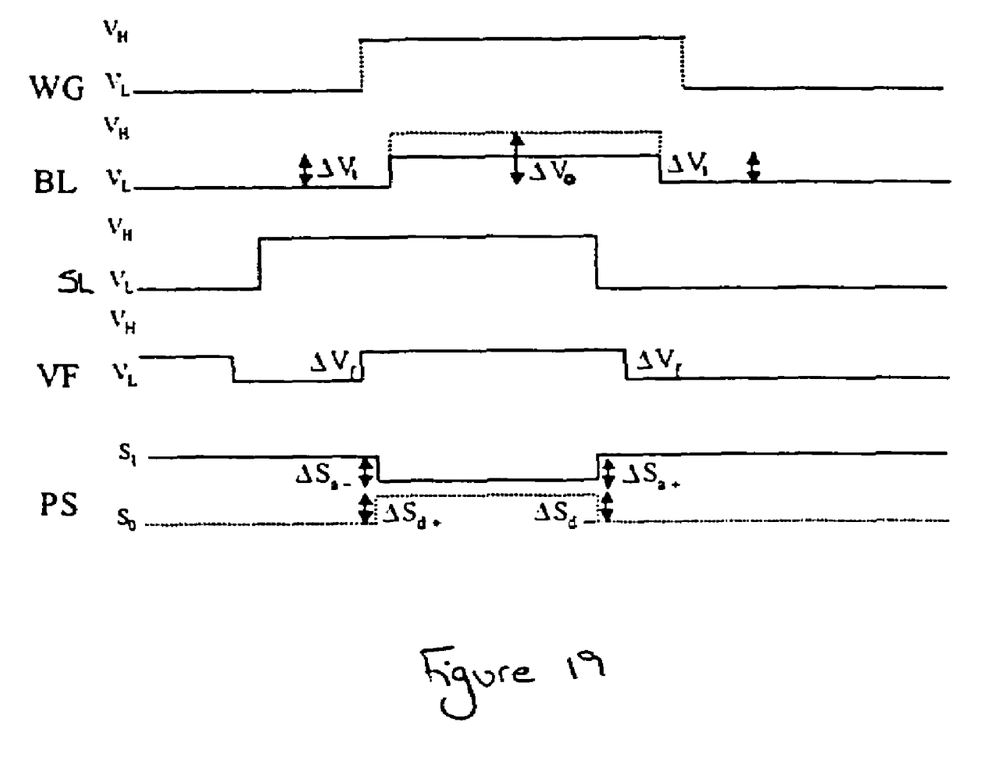
FIG. 19 illustrates a timing diagram for reading a digital "1" or "0" from a memory cell of a third embodiment of the present invention.

FIG. 19 illustrates a timing diagram for reading a digital "1" or "0" from a memory cell 101, by the third embodiment of the present invention. In order to read data from the memory cell 101, a sense amplifier is connected to the bit line 3.

The polarisation state stored in the FERAM capacitor 112 is read by setting the voltage of the bias line $V_{SL}$ low, forward biasing the photodiode 110 so that current flows from $V_F$, at electrode 112a of the FERAM capacitor 112, through the photodiode thereby equalising $V_{SL}$ and $V_F$. This results in the voltage $V_F$ at electrode 112a being set low. The voltage of the bias line $V_{SL}$ is then increased to a reading voltage, reverse biasing the photodiode 110, which is required to ensure that sufficient photons can be detected across the reverse bias region of the photodiode 110, and the voltage of the bit line $V_{BL}$ is set low. The selected light source 102 is then activated.

When the photodiode 110 of the selected memory cell 101 senses light (photons) from the wave guide 104, the photodiode 110 generates a current, and hence a voltage across the FERAM capacitor 112 by raising the voltage $V_F$ at electrode 112a by an amount $\Delta V_F$. The current and hence the voltage which is applied across the FERAM capacitor 112 can be increased or decreased by changing the bias across the photodiode 110. Additionally, the voltage which is applied across the FERAM capacitor 112 can be increased or decreased by changing the intensity of light from the light source 102. If the light source 102 is a laser, for example, then the intensity can be changed by altering the DC bias voltage of the laser. Similar considerations apply in respect of LEDs and other light sources. The change in voltage $\Delta V_F$ at the electrode 112a results in a change in the bit line voltage $V_{BL}$ which is sensed by the sense amplifier.

The change in the bit line voltage $V_{BL}$ depends on the polarisation state of the FERAM capacitor 112. The polarisation state $S_1$ corresponds to the FERAM capacitor 112 storing a digital "1" and the polarisation state $S_0$ corresponds to the FERAM capacitor 112 storing a digital "0". If the polarisation state of the FERAM capacitor 112 is $S_1$, then the change in bit line voltage $V_{BL}$ is $\Delta V_1$. However, if the polarisation state of the FERAM capacitor 112 is $S_0$, then the change in bit line voltage $V_{BL}$ is $\Delta V_0$. The change in bit line voltage $\Delta V_0$ is greater than the change in bit line voltage $\Delta V_1$. The sense amplifier is able to use a change in bit line voltage to distinguish between the two digital states.

Figure 24:
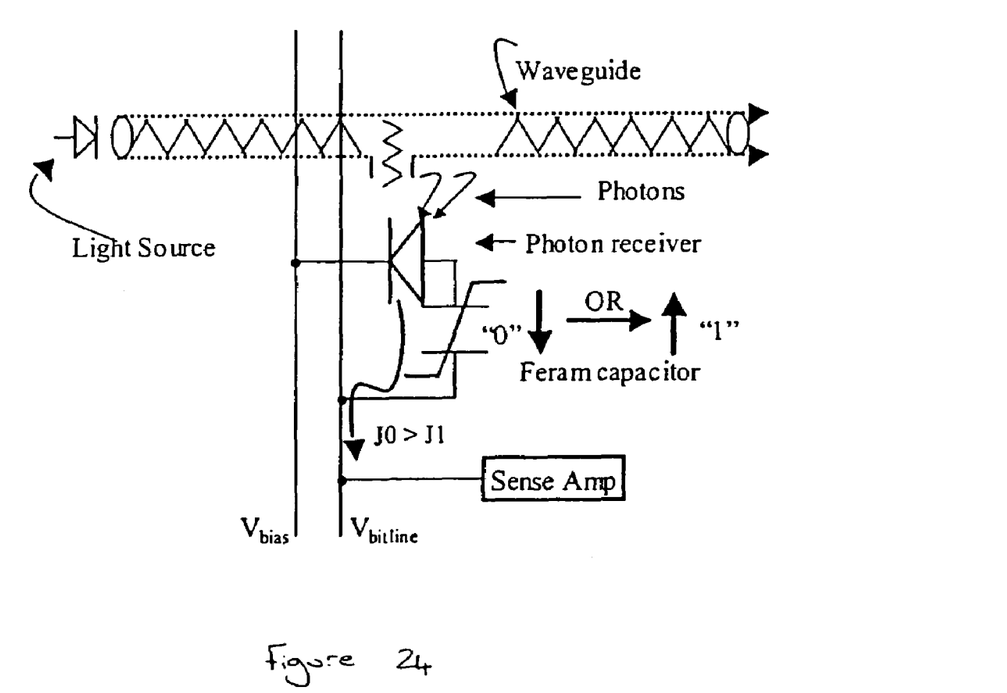
FIG. 24 is a representation of the reading of a memory cell as shown in FIG. 16.

The reading of the memory cell and the resultant current flow is represented in FIG. 24, in which a sense amplifier is connected to the bit line 3 to detect $\Delta V_1$ or $\Delta V_0$ as the case may be.

It is possible to perform non-destructive readout (NDRO) from a FERAM capacitor 112 when used in the optoelectronic memory of the third embodiment of the present invention. NDRO is described above with reference to the second embodiment of the present invention and FIG. 8.

Additionally FIGS. 5 to 7, 14 to 16 and 23 and 24 illustrate a non-volatile ferroelectric random access memory (FERAM) capacitor as the data storage unit. However, the present invention relates to an optoelectronic memory architecture and circuit for both volatile and non-volatile memory. Consequently, any volatile or non-volatile capacitor can be used in place of the FERAM capacitor, such as a static random access memory (SRAM) capacitor or a dynamic random access memory (DRAM) cell, for example a CT cell or the like.

The present invention allows for large memory arrays, which exhibit a higher bandwidth and throughput and a relative improvement in power dissipation compared with existing memory designs.

In an alternative embodiment the storage unit may be replaced by a light emitting device, an organic light emitting device or liquid crystal display device, such that the optoelectronic device functions as an optoelectronic display device.

The present invention is advantageous for use in small, mobile and large electronic products such as mobile phones, CD players, DVD players, computer displays and processors, personal digital assistants (PDAs), wireless technology, flat panel displays, large removable storage units, embedded storage systems, field programmable gate arrays (FPGAs) and CPLDs and the like—although it is not limited thereto.

Several electronic apparatuses using the above optoelectronic display device will now be described.

Figures 20, 21, 22:
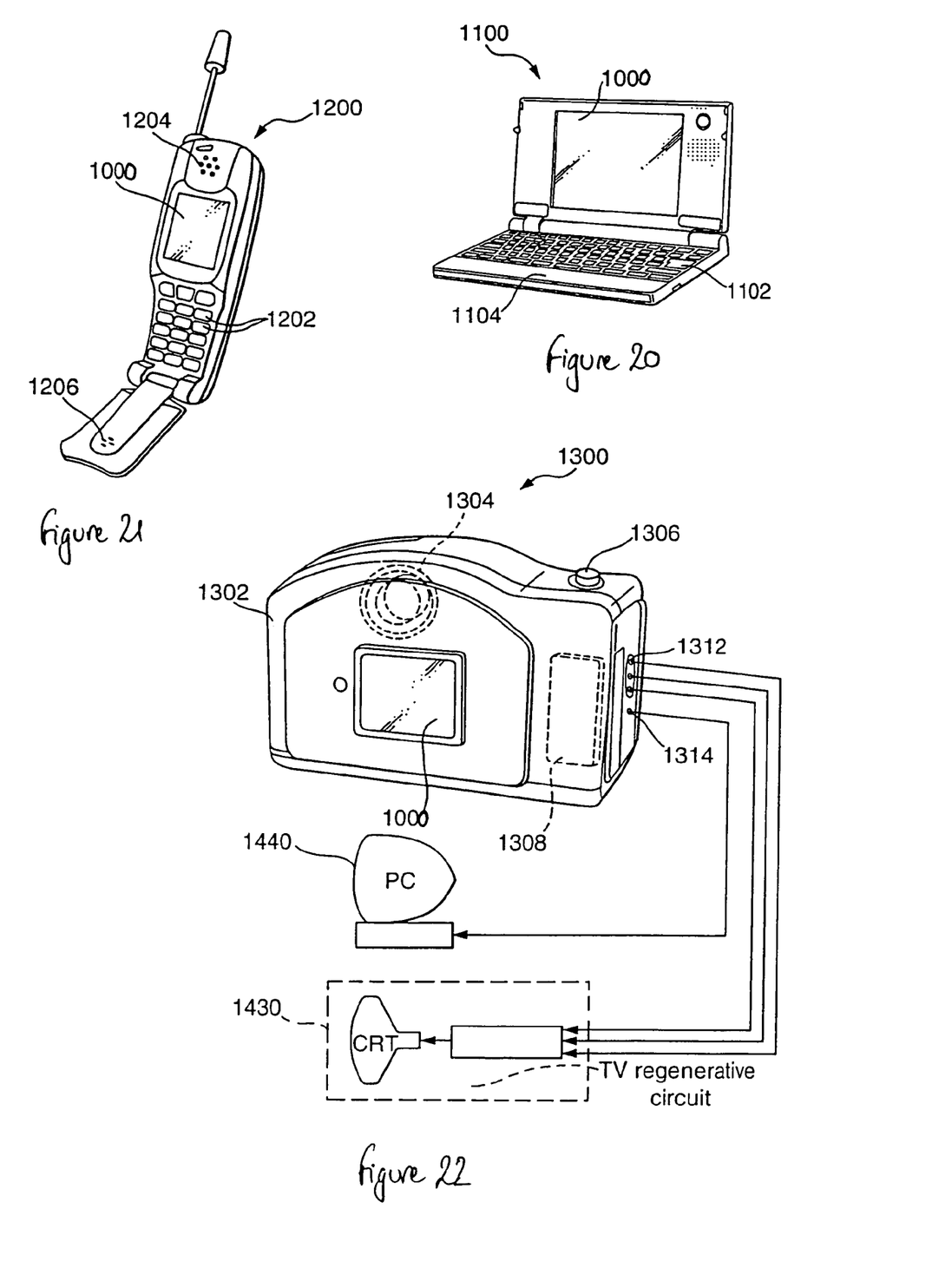
FIG. 20 illustrates a schematic view of a mobile personal computer incorporating an optoelectronic device of the present invention.
FIG. 21 illustrates a schematic view of a mobile telephone incorporating an optoelectronic device of the present invention.
FIG. 22 illustrates a schematic view of a digital camera incorporating an optoelectronic device of the present invention.

FIG. 20 is an isometric view illustrating mobile personal computer. The personal computer 1100 comprises a body 1104 including a keyboard 1102 and a display unit 1000. The display unit 1000 is implemented using an optoelectronic display device according to the present invention.

FIG. 21 is an isometric view illustrating a portable telephone. The portable telephone 1200 comprises a plurality of operation keys 1202, an earpiece 1204, a mouthpiece 1206, and a display panel 1000. The display panel 1000 is implemented using an optoelectronic display device according to the present invention.

FIG. 22 is an isometric view illustrating a digital still camera having connections to external devices. Typical cameras sensitise films based on optical images from objects, whereas the digital still camera 1300 generates imaging signals from the optical image of an object by photoelectric conversion using, for example, a charge coupled device (CCD). The digital still camera 1300 comprises a display panel 1000 at the back face of a case 1302 to perform display based on the imaging signals from the CCD. Thus, the display panel 1000 functions as a finder for displaying the object. A photo acceptance unit 1304 including optical lenses and the CCD is provided at the front side (behind in the drawing) of the case 1302. The display panel 1000 is implemented using an optoelectronic display device according to the present invention.

When a cameraman determines the object image displayed in the display panel 1000 and releases the shutter, the image signals from the CCD are transmitted and stored to memories in a circuit board 1308. In the digital still camera 1300, video signal output terminals 1312 and input/output terminals 1314 for data communication are provided on a side of the case 1302. As shown in the drawing, a television monitor 1430 and a personal computer 1440 are connected to the video signal terminals 1312 and the input/output terminals 1314, respectively, if necessary. The imaging signals stored in the memories of the circuit board 1308 are output to the television monitor 1430 and the personal computer 1440, by a given operation.

Examples of electronic apparatuses, other than the personal computer shown in FIG. 20, the portable phone shown in FIG. 21, and the digital still camera shown in FIG. 22, include television sets, view-finder-type and monitoring-type video tape recorders, car navigation systems, pagers, electronic notebooks, portable calculators, word processors, workstations, TV telephones, point-of-sales system (POS) terminals, and devices provided with touch panels. Of course, the above described embodiments of the present invention can be applied to the display sections of these electronic apparatuses. Moreover, the above described embodiments of the present invention can also be used in the processors and memory devices of any of these electronic apparatuses.

The aforegoing description has been given by way of example only and it will be appreciated by a person skilled in the art that modifications can be made without departing from the scope of the present invention. For example, the references in the description, drawings and claims appended hereto to a digital "1" and a digital "0" are arbitrary and interchangeable.

The invention claimed is:

1. An optoelectronic device comprising:
    a light source;
    a waveguide;
    first and second signal lines;
    a cell including a switching device and a ferroelectric capacitor connected in series between said first and second signal lines, said capacitor being electrically connected to said first signal line when said light source emits light through said waveguide, said light activating said switching device; and
    a control means for controlling said light source and said switching device;
    wherein said control means is configured such that, to write a digital value to said cell:

said switching device is first forward-biased, then reverse-biased; and in the reverse-biased state of said switching device, light from said light source activates said switching device and charges said capacitor to a voltage greater than a coercive voltage, $V_C$, of said capacitor.

2. An optoelectronic device as claimed in claim 1, wherein:

said switching device is a photodiode having first and second photodiode electrodes and said capacitor has first and second capacitor electrodes, said photodiode first electrode being coupled to the first signal line, said photodiode second electrode being coupled to said capacitor first electrode, and said capacitor second electrode being coupled to said second signal line, and said control means is configured such that:

the potential $V_{SL}$ on said first signal line is taken to a low value, thereby forward-biasing said photodiode, and is then taken to a high value, the potential $V_{BL}$ on said second signal line being taken to a low value, whereby said photodiode is reverse-biased.

3. An optoelectronic device as claimed in claim 2, wherein, to write a digital "1" to said cell:

when said light is transmitted through said waveguide, a voltage $V_F$ on the photodiode second electrode is allowed to rise to a value relative to a low value of the potential $V_{BL}$ on said second signal line, such that $V_F - V_{BL} > V_C$; and to write a digital "0" to said cell:

when said light is transmitted through said waveguide, the potential $V_{BL}$, on the second signal line is taken to a high value, and a voltage $V_F$ on the photodiode second electrode is allowed to rise to a value just above a minimum logic level, such that $V_{BL} - V_F > V_C$.

4. An optoelectronic device as claimed in claim 3, further comprising:

a sense amplifier having an input connected to said second signal line.

5. An optoelectronic device as claimed in claim 4, wherein:

to read a digital value from said cell, said control means is configured to first forward bias said photodiode so that both $V_{SL}$ and $V_F$ are low, then reverse-bias said photodiode by setting $V_{SL}$ high and $V_{BL}$ low while $V_F$ remains low, and to transmit said light through said waveguide to activate said photodiode, whereby a small excitation signal $\Delta V_F$ arises at the capacitor first electrode, thereby leading to a voltage change $\Delta V_{BL}$ at the second signal line, which is sensed by said sense amplifier.

6. An optoelectronic device as claimed in claim 5, wherein:

said voltage change $\Delta V_{BL}$ for a digital "0" is greater than that for a digital "1".

7. An optoelectronic device according to claim 1, wherein:

the optoelectronic device is a display device.

8. An optoelectronic device according to claim 1, wherein:

the light source is an array of light emitting devices.

9. An optoelectronic device according to claim 1, further comprising:

a plurality of wave guides, a plurality of first and second signal lines and a plurality of cells.

* * * * *